(12) United States Patent
Johnson et al.

(10) Patent No.: US 7,936,953 B2
(45) Date of Patent: May 3, 2011

(54) OPTICAL PRINTED CIRCUIT BOARD AND MANUFACTURING METHOD

(75) Inventors: Ian David Johnson, West Sussex (GB); Richard Charles Alexander Pitwon, Fareham (GB); David R. Selviah, Bedford (GB); Ioannis Papakonstantinou, London (GB)

(73) Assignee: Xyratex Technology Limited, Havant (GB)

( * ) Notice: Subject to any disclaimer, the term of this patent is extended or adjusted under 35 U.S.C. 154(b) by 318 days.

(21) Appl. No.: 11/995,065

(22) PCT Filed: Jun. 30, 2006

(86) PCT No.: PCT/GB2006/002441
§ 371 (c)(1),
(2), (4) Date: Jul. 9, 2008

(87) PCT Pub. No.: WO2007/010184
PCT Pub. Date: Jan. 25, 2007

(65) Prior Publication Data
US 2009/0162004 A1    Jun. 25, 2009

Related U.S. Application Data

(60) Provisional application No. 60/699,382, filed on Jul. 15, 2005.

(51) Int. Cl.
*G02B 6/12* (2006.01)
*G02B 6/26* (2006.01)

(52) U.S. Cl. .......... 385/14; 385/49; 385/50; 385/52; 385/89

(58) Field of Classification Search .......... 385/14, 385/49, 50, 89
See application file for complete search history.

(56) References Cited

U.S. PATENT DOCUMENTS

| | | | |
|---|---|---|---|
| 5,299,276 A * | 3/1994 | Okamura et al. | 385/130 |
| 5,375,184 A | 12/1994 | Sullivan | |
| 5,835,646 A | 11/1998 | Yoshimura | |
| 5,898,803 A | 4/1999 | Mueller-Fiedler | |
| 6,227,722 B1 | 5/2001 | Kropp | |
| 6,553,171 B1 | 4/2003 | Takahashi | |
| 2001/0009597 A1 | 7/2001 | Alibert | |
| 2001/0055447 A1 * | 12/2001 | Delprat et al. | 385/50 |
| 2002/0181882 A1 | 12/2002 | Hibbs-Brenner | |
| 2004/0022499 A1 | 2/2004 | Shimizu | |
| 2004/0037512 A1 | 2/2004 | Cho | |

FOREIGN PATENT DOCUMENTS

| | | |
|---|---|---|
| DE | 198 26 648 | 12/1999 |
| EP | 1 286 194 | 2/2003 |
| JP | 06281826 A * | 10/1994 |

OTHER PUBLICATIONS

Patent Abstracts of Japan, vol. 018, No. 402, English Abstract of JP 06 118256, filed Apr. 28, 1994.
Patent Abstracts of Japan. vol. 005, No. 182, English Abstract of JP 56 110907, filed Sep. 2, 1981.

\* cited by examiner

*Primary Examiner* — Hemang Sanghavi
(74) *Attorney, Agent, or Firm* — Pillsbury Winthrop Shaw Pittman LLP

(57) ABSTRACT

The invention provides a method of manufacturing an optical printed circuit board and an optical printed circuit board. The method comprises providing a support layer; on the support layer, providing an optical core layer; forming optical channels from the optical core layer and surrounding the optical channels with cladding thereby forming optical waveguides; and during said step of forming the optical channels, forming one or more alignment features, e.g. projections, on the optical printed circuit board.

25 Claims, 22 Drawing Sheets

OPTICAL PRINTED CIRCUIT BOARD AND MANUFACTURING METHOD

CROSS REFERENCE TO RELATED APPLICATIONS

This is the U.S. National Phase of PCT/GB2006/002441, filed Jun. 30, 2006, which in turn claims priority to U.S. provisional application No. 60/699,382 filed Jul. 15, 2005, both of which are incorporated herein in their entirety by reference.

The present invention relates to an optical printed circuit board and a method of manufacturing an optical printed circuit board. In a particular embodiment, the invention also relates to a method of forming an optical via on an optical printed circuit board.

Optical printed circuit boards (PCBs) have optical waveguides that are used for the transmission of light signals between components, as well as or instead of conventional copper conductors. Typically, an optical PCB consists of a base or support layer. In areas of the optical PCB where optical waveguides are required, a lower optical cladding layer is provided usually of uniform thickness. On top of this, a layer of optical core material is laid down. The optical core material has a higher refractive index than the cladding layer and will eventually form one or more optical waveguides on the optical PCB. In some cases, an inverted PCB is laminated on top forming a sandwich-like structure.

In a known process used for making optical PCBs, the core layer is laid down in liquid form, e.g. as a curable liquid monomer or polymer. A mask having openings corresponding to the desired shape of the waveguides is arranged over the liquid polymer and the entire resultant structure is then irradiated with electromagnetic radiation of suitable wavelength. Thus, in regions of the mask which are open, the liquid monomer or polymer is cured. In other regions, the polymer remains liquid. The mask is removed and the remaining liquid polymer can be washed away leaving the desired pattern of optical waveguides.

The remaining core material is typically arranged in patterns of channels which are arranged in some manner so as to be able to couple optical signals between components on the optical PCB when the components are arranged thereon. Last, an upper cladding layer is laid down, so that the channels of core material are completely surrounded by cladding material, and therefore are able to function as optical waveguides. FIG. 1 shows a schematic representation of such a conventional optical PCB.

The PCB 2 comprises a base or support layer 4 upon which is arranged a lower cladding layer 6. A plurality of optical waveguides 8 are arranged on the lower cladding layer 6 and have arranged around them an upper cladding layer 10. Thus, the optical waveguides are entirely surrounded by cladding material of the upper cladding layer 10 and the lower cladding layer 6. Typically, the height H of the optical waveguides will be of the order 50 to 70 μm. The width W of each of the optical waveguides is typically of the order 50 μm. The waveguides can be fabricated to very high accuracy, currently of the order of 2-5 μm. High accuracy is an important requirement of any optical waveguide structure.

In order to couple optical signals into the waveguides 8, optical components such as transmitters, receivers, 45° mirrors and other optical waveguides, must be aligned with respect to the optical waveguide input interfaces with a misalignment tolerance of usually not more than ±15 μm. Conventionally, when arranging optical components on an optical PCB to ensure sufficiently accurate alignment with the optical waveguide input interfaces, the alignment is performed manually using microscopes. For example, a light source is arranged near the input to one or more of the waveguides and the output from the or each of the waveguides is detected. The light source is then moved relative to the input until the optical output power is maximised to indicate satisfactory alignment. The light source may then be fixed in this position. This is extremely time consuming and therefore expensive. Thus, such a method of manual alignment is not suitable for mass production.

U.S. Pat. No. 5,375,184 (Sullivan) discloses a flexible optical coupler for coupling light signals from an optical circuit board to an optical waveguide on another circuit board. The coupler is referred to as being "self-aligning" by virtue of the use of alignment stops fabricated in close proximity to the optical waveguide or optical port.

According to a first aspect of the present invention, there is provided a method of manufacturing an optical printed circuit board, the method comprising: providing a support layer; on the support layer, forming optical waveguides; during said step of forming the optical waveguides, forming one or more alignment features or projections on the optical printed circuit board; and, providing a cladding layer to partially cover the alignment features or projections such that part of the or each of the alignment features or projections is not covered by the cladding layer.

The invention provides a method of manufacturing an optical PCB in which during the step of forming the optical waveguides, one or more alignment features or projections are formed. Since the alignment projections are formed in the same step as forming the optical waveguides, the alignment projections are inherently aligned extremely accurately with respect to the waveguides. The alignment projections are partially covered by an upper cladding layer so that at least part of the or each of the alignment projections remains exposed to enable easy alignment of an optical component with the projection.

By providing a cladding layer to partially cover the alignment projections, increased strength and mechanical support is provided to the alignment projections. This is important as the alignment projections, in use, may frequently be impacted or contacted during arrangement of an optical component against the projection.

Furthermore, by providing the upper cladding in such a way as to ensure that the alignment projections are partially uncovered this enables access to the alignment projections to be achieved whilst providing the benefit of the increased mechanical support etc. discussed above.

It is preferred that the upper cladding provided to partially cover the alignment projections is part of the same layer of upper cladding arranged on the optical waveguides on the optical printed circuit board. This enables simple manufacture of the optical printed circuit board as a common mask may be used to pattern the upper cladding on the entire structure.

Preferably, the step of forming the one or more optical waveguides comprises providing an optical core layer; forming optical channels from the optical core layer and surrounding the optical channels with cladding.

Preferably, the alignment projections are formed of the same material as the optical channels and in one particular embodiment are formed from the same layer of material as the optical waveguides themselves.

In other words, in one embodiment the alignment projections are formed of core material. The alignment projections may be used to ensure highly accurate registration of components that will interface with the optical waveguides. Thus, optical components can be positioned to an extremely high level of accuracy, typically around 5 µm. This is well within the currently required accuracy of 15 µm. Furthermore, in embodiments, the invention provides a simple and robust method by which an optical PCB can be manufactured. Thus, in certain embodiments, the method according to the present invention is suitable for mass production of optical PCBs.

According to a second aspect of the present invention, there is provided an optical printed circuit board comprising: a support layer; one or more optical waveguides formed on the support layer; and at least one alignment projection formed on the support layer in a predetermined position with respect to the one or more optical waveguides, thereby enabling alignment of other components with the optical waveguides by reference to the alignment projections.

In an embodiment, the invention provides an optical printed circuit board in which one or more optical waveguides are formed on a support layer and at least one alignment projection is also formed on the support layer in a predetermined position with respect to the one or more optical waveguides. The fact that an alignment projection is formed in a predetermined position with respect to the optical waveguides means that the alignment projection can be used as a reference point when aligning other components on the optical printed circuit board with the one or more optical waveguides. Thus, extremely accurate alignment of the other components with the optical waveguides can be achieved.

According to a further aspect of the present invention, there is provided a method of manufacturing an optical printed circuit board, the method comprising: providing a support layer; on the support layer, forming optical waveguides; and during said step of forming the optical waveguides, forming one or more alignment features which may or may not be projections. The alignment features may be one or more recesses in the support layer.

According to a further aspect of the present invention, there is provided a method of manufacturing an optical printed circuit board, the method comprising: providing a support layer; on the support layer, forming one or more optical waveguides; during said step of forming the optical waveguides, forming one or more alignment projections on the optical printed circuit board; and, arranging a socket in alignment with the one or more alignment projections for receiving a plug for connection to another optical backplane.

This embodiment provides a method of making an optical printed circuit board in which a receptacle or socket is provided to enable connection of the optical printed circuit board to another optical printed circuit board. By aligning the socket with the alignment projections, the optical printed circuit board may be easily and accurately connected to another optical printed circuit board. It is envisaged that in one example, one of the optical printed circuit boards is an optical backplane and the other, to which the first is connected, is a user circuit or daughtercard.

This embodiment relates to the method of manufacture but it will be appreciated that a corresponding aspect relates to the optical printed circuit board itself.

Examples of the present invention will now be described in detail with reference to the accompanying drawings, in which:

FIG. 4b shows a plan view from below of a mount for use on the PCB of FIG. 4a;

Figure 1:
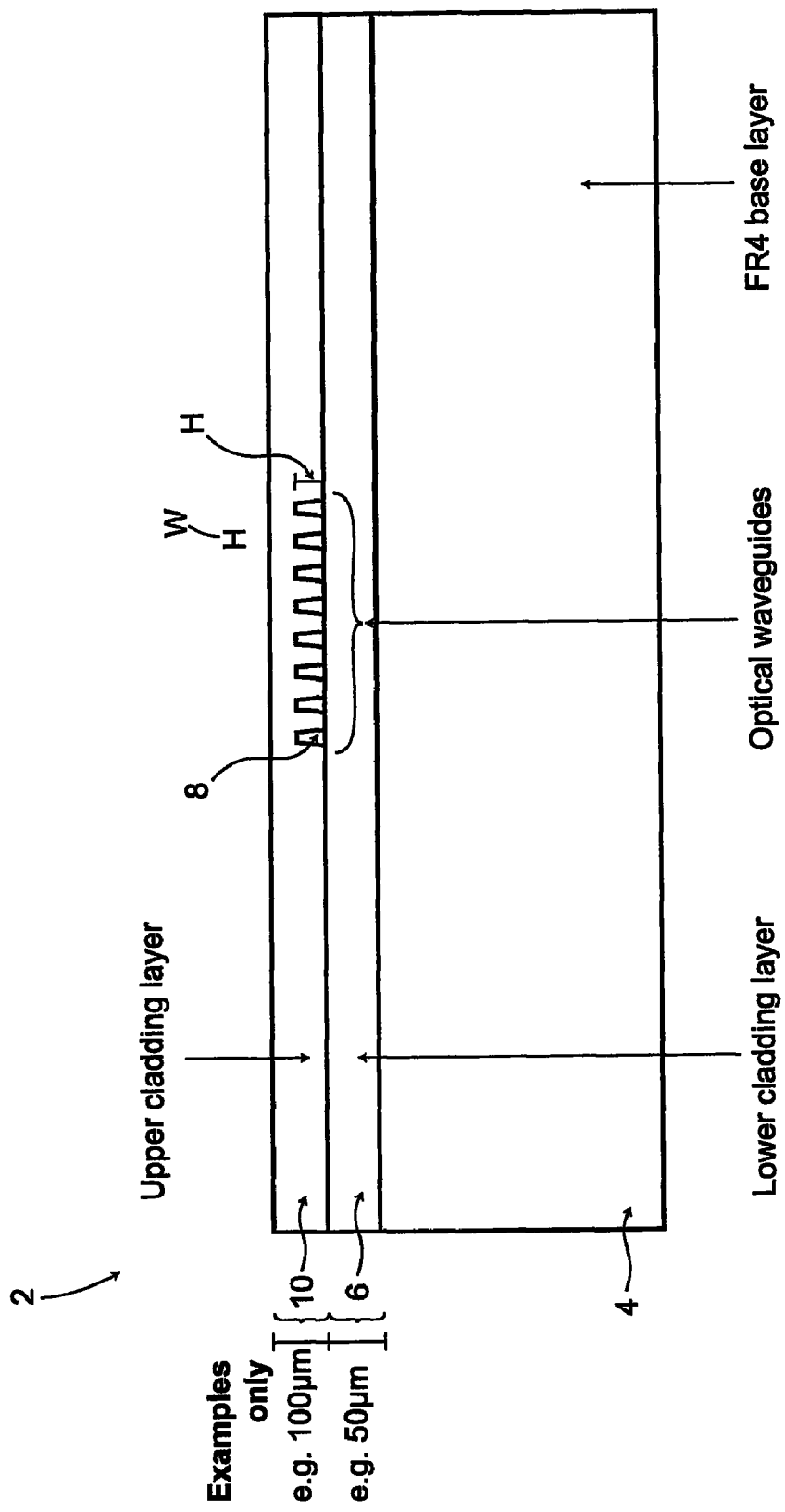
FIG. 1 shows a schematic section through a conventional optical PCB.
Figure 2:
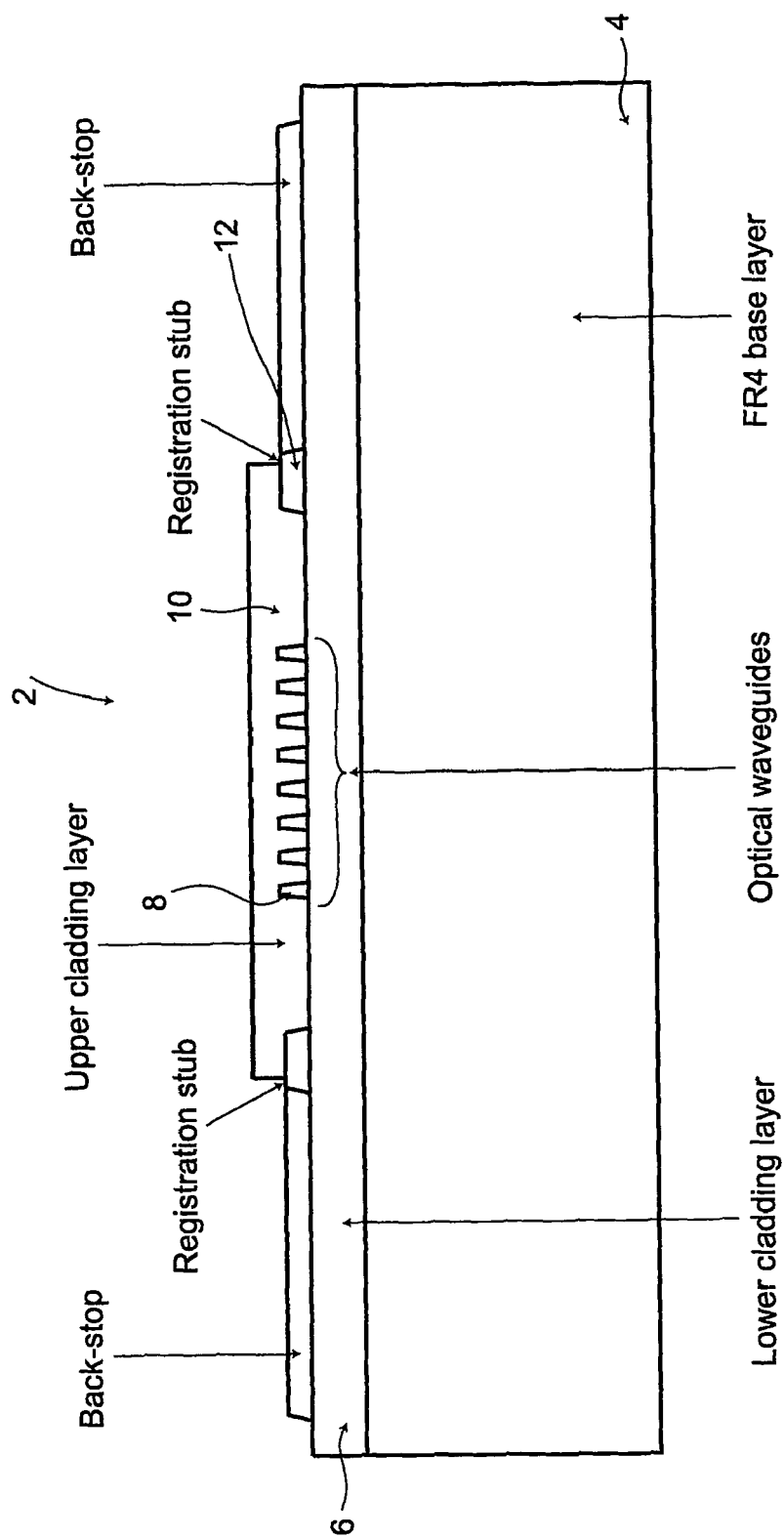
FIG. 2 shows a section through an example of an optical PCB according to an embodiment of the present invention.

FIG. 2 shows a section through an example of an optical PCB 2 according to an embodiment of the present invention. As with the optical PCB shown in FIG. 1, the optical PCB 2 of FIG. 2 comprises a base or support layer 4 on which is arranged a lower cladding layer 6. A plurality of optical waveguides 8 are provided on the lower cladding layer 6, and are surrounded by an upper cladding layer 10. In addition, one or more alignment features (projections in this specific case) 12 are provided on the lower cladding layer 6. The method of manufacture of the optical printed circuit board will be explained in more detail below.

In the specific example shown, the alignment projections 12 are formed of the same material and from the same layer as that from which the optical waveguides 8 are formed. The alignment projections 12 serve to provide a reference on board the optical PCB to enable accurate registration and alignment of other optical components with the optical waveguides 8. In particular, they enable extremely accurate alignment of optical components such as transmitters, receivers, 45° mirrors and other optical waveguides, with one or more of the optical waveguides 8.

The optical waveguides 8 and the alignment projections 12 need not necessarily be formed of the same material and/or at the same level with respect to the support layer 4. However, use of the same material and the same layer simplifies manufacture of the optical PCB. Furthermore, by manufacturing the alignment projections and the optical waveguides from the same layer, this ensures that vertical alignment as well as horizontal alignment of a subsequently positioned component with respect to the optical waveguides can be achieved. In other words, the component subsequently positioned on the PCB may be located on the lower cladding layer itself, in some way abutting the alignment projections. Thus presuming the lower cladding layer is flat, the subsequently positioned component will necessarily be at the same vertical level (on the PCB) as the waveguides.

To manufacture an optical printed circuit board 2 as shown in FIG. 2, initially, a support layer 4 composed of a common PCB material such as FR4 is provided. On the support layer, a lower cladding layer 6 is provided. An optical core layer (from which the optical waveguides 8 will be formed) is then formed on the lower cladding layer 6. Using conventional lithographic techniques and/or other conventional PCB manufacturing techniques, channels of the material of the optical core layer which will eventually form the optical waveguides are formed. In addition and in the same step, the alignment projections 12 are also formed. Thus, the optical waveguides and the alignment projections are formed during the same manufacturing step.

This does not necessarily mean that the waveguides 8 and the alignment projections are formed simultaneously, but rather that they are formed during the same general processing step. Thus, it is possible to achieve extremely accurate relative positioning of the alignment projections and the optical waveguides 8. This means that subsequently, seeing as the positioning of the alignment projections 12 is known and the relative distances between the alignment projections 12 and the optical waveguides 8 are known, it is possible to use the alignment projections 12 to ensure registration of other optical components with the optical waveguides 8. Therefore, the exposed optical alignment projections, can be used as a highly accurate registration feature for the placement of components that will interface with the optical waveguides 8. The alignment projections can thus be positioned to an accuracy of around 5 μm.

During manufacture of an optical PCB, initially, the lower cladding layer 6 is formed on the support layer 4. After this, the optical waveguides 8 and the alignment projections 12 are formed. These may be formed using any known lithographic techniques. A lower cladding layer is formed and may be spin coated to ensure uniform thickness of the liquid polymer layer. Preferably the lower cladding layer is planarised. Typically, a layer of a curable liquid polymer such as an acrylate or polyimide is formed on the lower cladding layer 6. A mask is then arranged over the liquid polymer layer and radiation is used to cure the exposed structure. The mask is then removed and the uncured (still liquid) material is removed. This leaves a pattern of channels that will later form the optical waveguides 8 and also the alignment projections 12. The upper cladding layer 10 is then applied. Trenched waveguides could also be used in the optical PCB.

As well as lithographic techniques, other techniques can be used in any or all of the steps of forming the optical PCB. Examples include direct laser writing, direct electron beam writing, embossing, ink jet printing or micro jet printing The upper cladding layer 10 may be applied and/or formed using a second mask. For example, a curable polymer may be provided in liquid form and then a second mask may be used to selectively form a solid upper cladding layer in desired regions. The tolerance required for the formation of the upper cladding layer is significantly lower than that required for the formation of the waveguides and alignment features or projections.

In a preferred example, the first mask or common mask used to form the waveguides and the alignment features or projections also includes an opening to define an optical alignment point. The optical alignment point is simply a feature at some position on the structure that is used to optically align a second mask for forming the upper cladding layer. Since the required tolerance is lower for the formation of the upper cladding layer, the use of an optical alignment point enables sufficient accuracy in the positioning of the second mask.

Clearly, many of the techniques used in the manufacture of layered products such as the optical PCB shown in FIG. 2 are known. A more detailed description will therefore not be provided. However, it should be appreciated that it is significant that the alignment projections 12 and the optical waveguides 8 may be formed using a common mask. This provides inherent accuracy in the relative positioning of the resultant structures formed on the lower cladding layer 6. As will be explained below, this is important as it enables subsequent use of the alignment projections 12 to ensure accurate positioning of other components on the optical PCB 2 with respect to the input interfaces of the optical waveguides 8. Furthermore, as mentioned above, in the case in which the alignment projections and the waveguides are all formed on the same layer, e.g. the lower cladding layer, vertical positioning of a subsequently provided component is ensured, as well as horizontal positioning with respect to the input interfaces of the waveguides.

Referring again to example shown in FIG. 2, it can be seen that the upper cladding layer 10 arranged on the optical waveguides 8 does not entirely cover the alignment projections 12. Parts of the alignment projections 12 are visible from above when the upper cladding layer 10 is present. This means that the alignment projections are available for registration of other optical components with the optical waveguides 8. The upper cladding partially covers the or each of the alignment features or projections providing additional mechanical and structural strength whilst still enabling the uncovered parts to enable alignment of other components.

Figure 3:
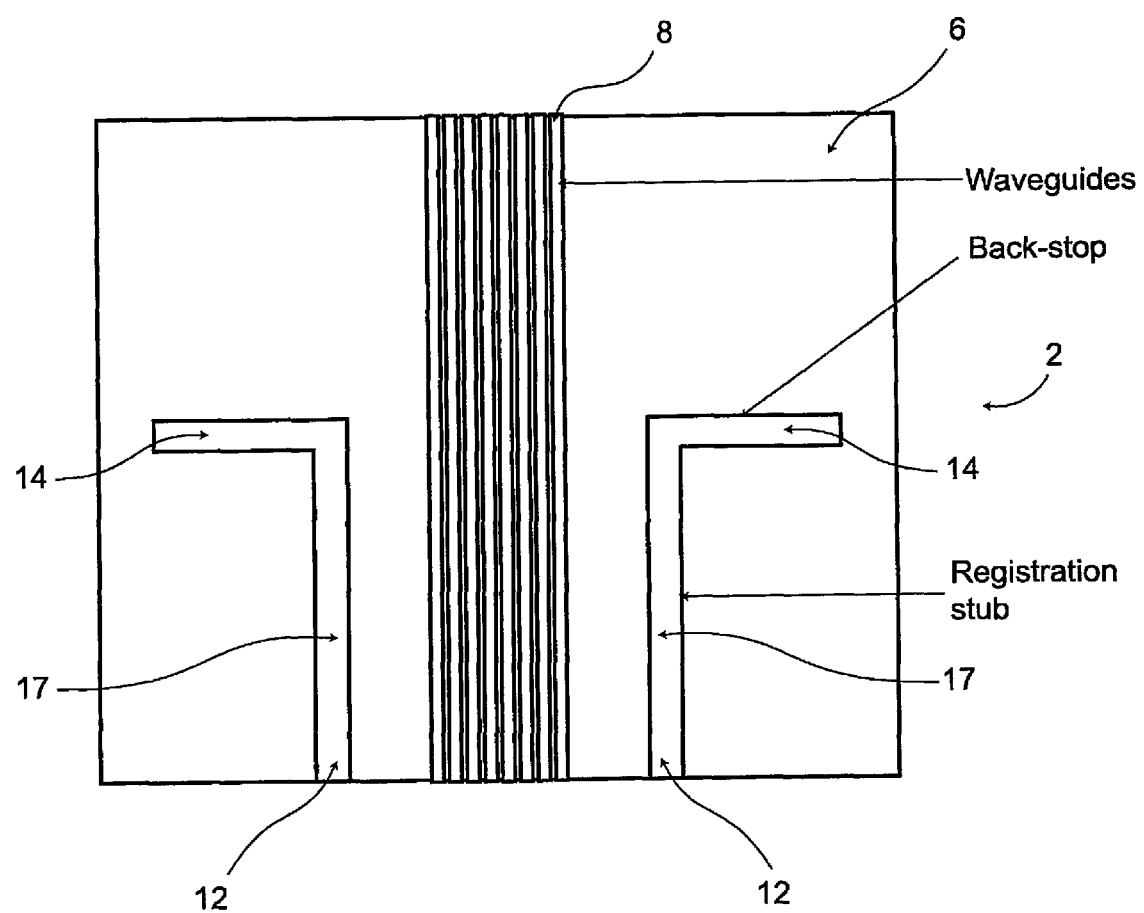
FIG. 3 shows a plan view of a horizontal section through an example of an optical PCB according to an embodiment of the present invention.

FIG. 3 shows a plan view of the optical waveguides 8 and the alignment projections 12 taken in horizontal section through an optical PCB 2. The alignment projections 12 are formed on the lower cladding layer 6. In the example shown, the alignment projections 12 are formed from the same layer and the same material as the optical waveguides 8. As explained above, the optical alignment projections 12 are formed during the step of forming the optical channels that define the optical waveguides 8. Thus, it is possible to obtain extremely accurate relative positioning of the alignment projections 12 and the optical waveguides 8. The alignment projections 12 are substantially L-shape, having back stop sections 14 and sides 17 substantially parallel to the optical waveguides 8.

Figure 4A:
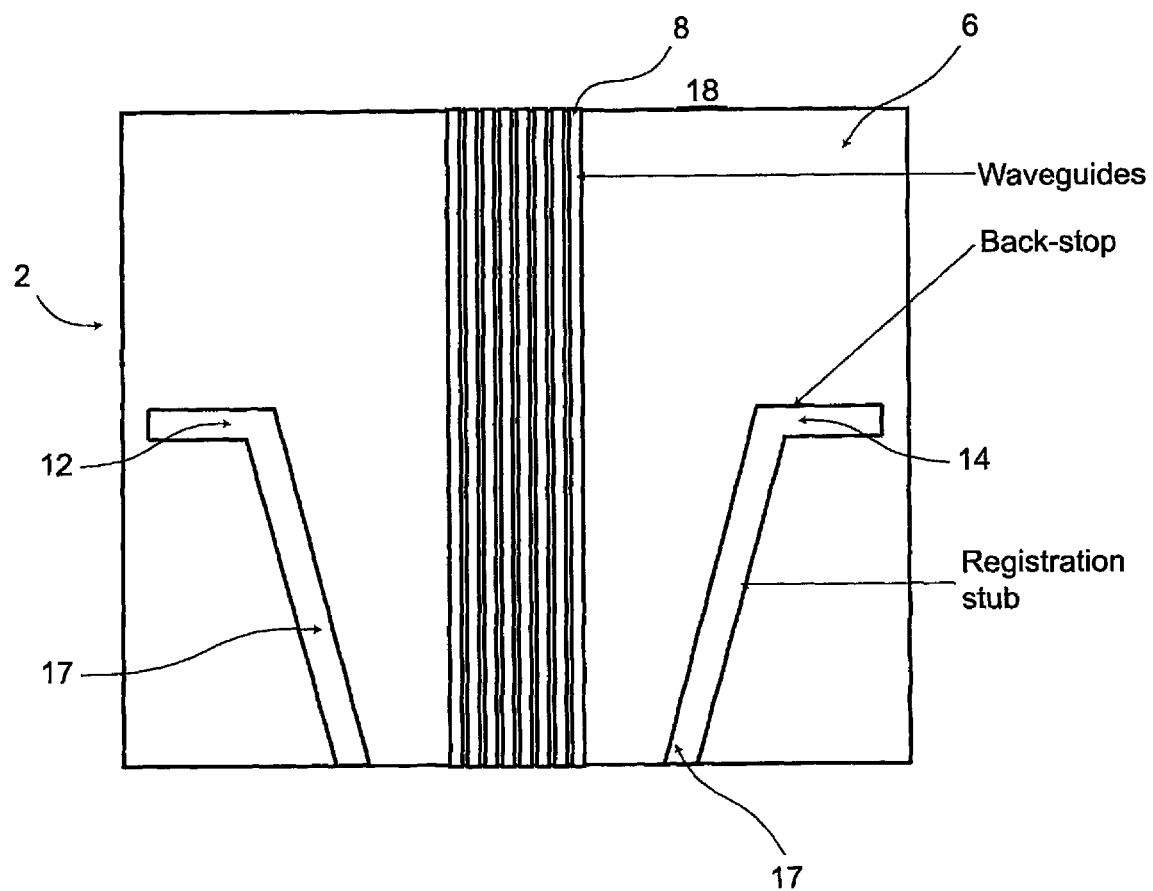
FIG. 4a shows another example of a horizontal section through an example of an optical PCB according to an embodiment of the present invention.

FIG. 4a shows a plan view of another embodiment of an optical PCB 2 according to the present invention. Components in FIG. 4a common to the examples of FIGS. 1 and 2 are numbered in the same way as the corresponding components in FIGS. 1 and 2. In the example shown in FIG. 4, it will be appreciated that the sides 17 of the alignment projections 12 are inclined with respect to the axial direction of the waveguides 8, rather than orthogonal with the back stops 14 (as in the example of FIG. 7). This is a particularly preferred embodiment since it facilitates the accurate positioning of a correspondingly shaped mount or other such component. For example, a mount such as a generally inverted U-shape structure may be provided, wherein the feet of the inverted U-shape mount are shaped and configured to slide onto the PCB and engage the alignment projections.

Figure 4B:
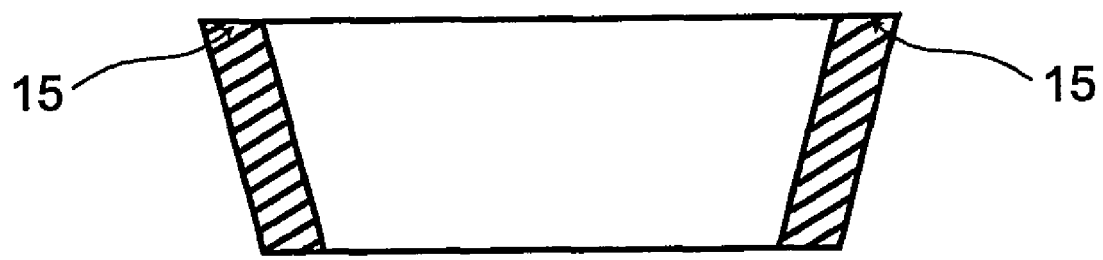

This embodiment is particularly preferred as it means that the alignment projections can easily be used to provide a reference point for a different component to be mounted onto the optical PCB. FIG. 4b shows a plan view from below of such a mount. The mount has feet 15 that are not parallel and indeed are angled in such a manner that when positioned on the lower cladding layer 6 of a PCB like that shown in FIG. 4a, they may be slid along the lower cladding layer on the outer side of the angled side sections 17 of the alignment projections until they can move no further.

In a preferred example, the waveguides are tapered such that they are wider at the input end than they are at the output end (and indeed possibly along most of their lengths). Thus the waveguides have larger input interfaces than they would if they were not tapered so that alignment of other components with the input interfaces is made easier still.

Figure 5A:
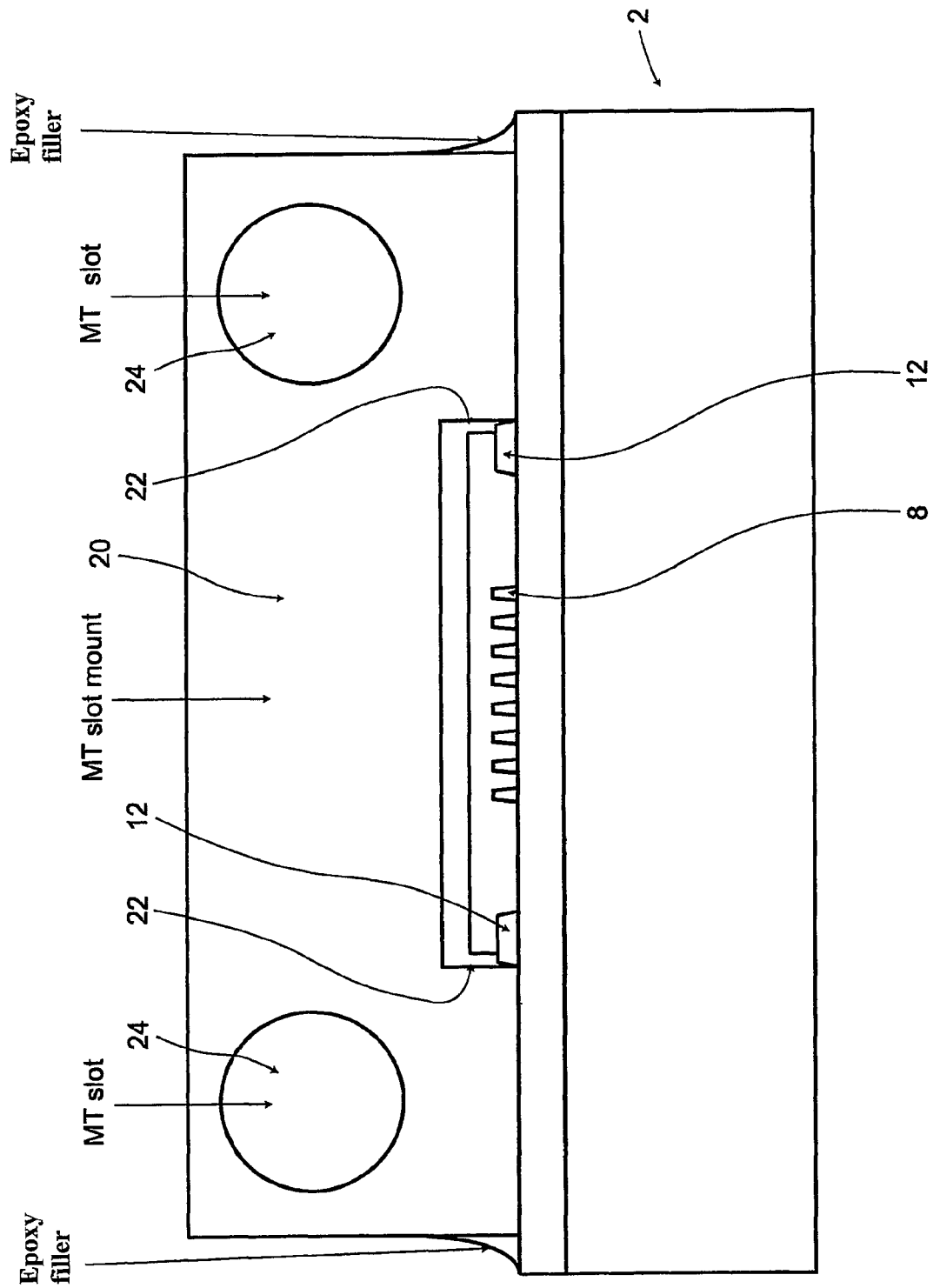
FIGS. 5A and 5B show vertical sections through examples of optical PCBs according to embodiments of the present invention.

FIG. 5A shows a section through an optical PCB according to an embodiment of the present invention. In the example shown, in addition to the components of the PCB, a connector 16 is mounted on the optical PCB 2. In the example shown, the connector is a MT slot mount. Any standard or non-standard parallel optical connector could be used. An example of a standard parallel optical connector is an MT or MT-style interface or ferrule.

In this example, the MT slot mount 16 is arranged such that it contacts the outer edges of the alignment projections 12. Thus, by virtue of the fact that the precise position of the alignment projections 12 with respect to the waveguides 8, is known, this means that an optical interface that is connected via the MT slot mount can accurately be aligned in registration with the input interfaces of the optical waveguides 8. Furthermore, since in the example shown, the alignment projections are formed of the same layer as the waveguides, vertical, as well as horizontal alignment of a subsequently positioned component with the input interfaces of the waveguides, may easily be achieved.

In the example shown in FIG. 5A, the MT mount 20 is positioned in such a way that an inner surface 22 of the mount on each side of the mount abuts the alignment projection 12 on that side. Thus, given the fixed arrangement of the slots 24 in the MT mount 20 this means that when a laser source is mounted on the MT mount 20, the precise positioning of the optical sources within the laser source will be known. In addition, the precise separation relative to the interfaces of the optical waveguides 8 is known. Thus, accurate alignment of the laser sources with the input interfaces of the optical waveguides is possible.

Figure 5B:
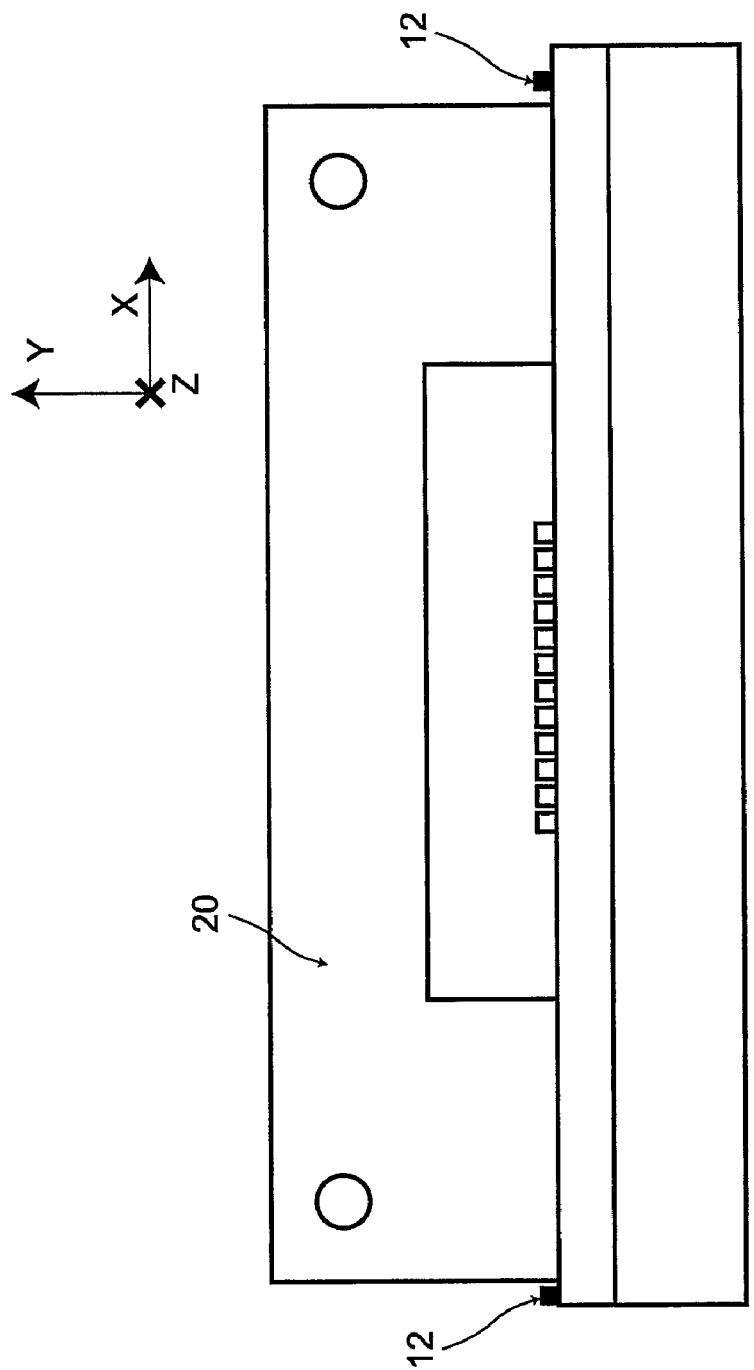

The mount 20 or indeed any component arranged on the PCB using the alignment projections 12 for alignment with the waveguides may be fixed to the PCB using any desired means. Typically the component may be fixed with glue or solder. Suitable glues include epoxy resin, UV setting glue or Superglue®. Preferably, the means selected does not itself affect the vertical and/or horizontal positioning of the component on the PCB. FIG. 5B shows a further example of a section-through an optical printed circuit board. In this example, the connector or socket is arranged within the inner edges of the alignment features or projections 12. As in the example of FIG. 5A, the mount 20 is formed on the same layer as the alignment projections 12. Thus, vertical or Y alignment is achieved.

Figure 6:
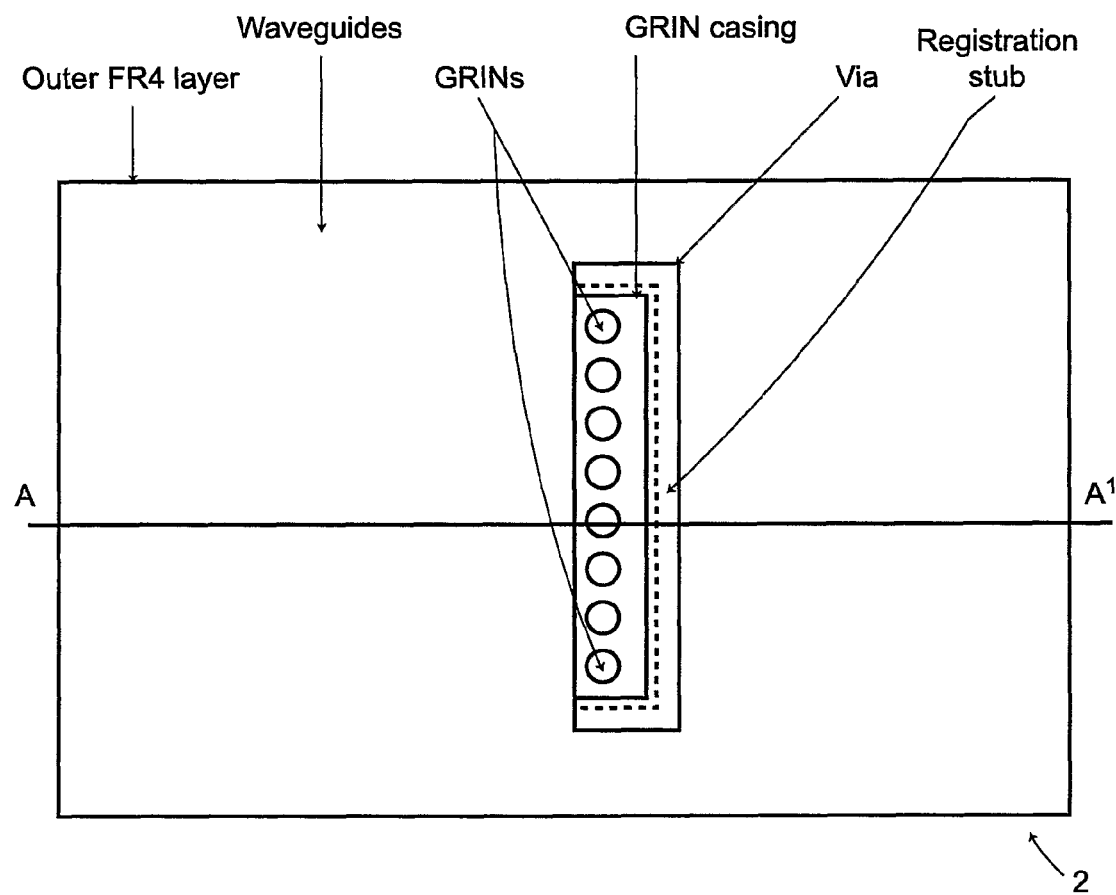
FIG. 6 shows a plan view of an optical via.
Figure 7:
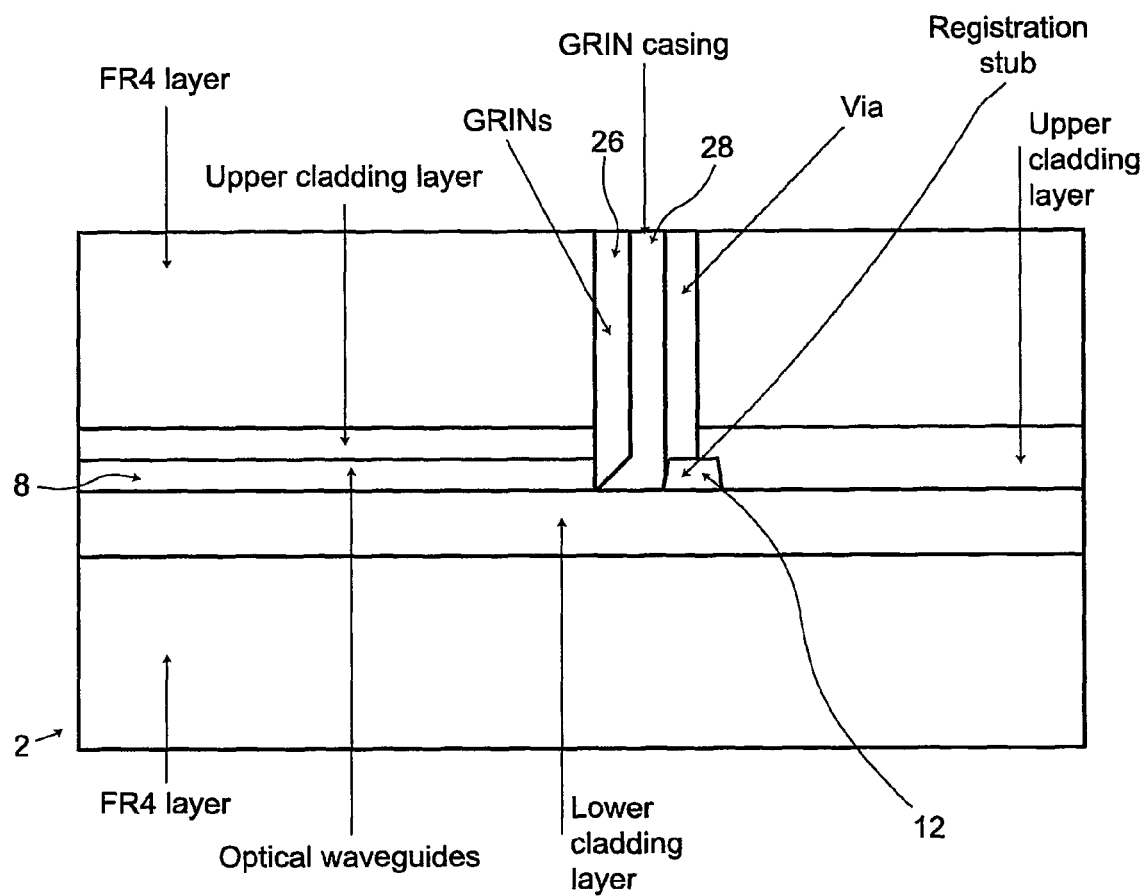
FIG. 7 shows a vertical section through the optical PCB of FIG. 6 along the line A A' in FIG. 6.

FIG. 6 shows a plan view of an optical via formed within an optical PCB 2. FIG. 7 shows a vertical section through the optical PCB 2 of FIG. 6 along the line A A'. Referring to both of FIGS. 6 and 7, the optical PCB 2 comprises a plurality of optical waveguides 8. An alignment projection 12 is also provided arranged on the optical PCB 2. As with the examples shown above and described with reference to FIGS. 2 to 5, the alignment projection 12 is formed at a known distance from the optical waveguides 8, thus enabling use of the alignment projection 12 to ensure registration between another optical component and the optical waveguide 8.

In the examples shown in FIGS. 6 and 7, the other optical component is a graded index (GRIN) lens 26 (or GRIN lens array) and its casing 28. The GRIN lens array 26 enables communication of external photonics with the optical waveguides 8 internal to the PCB 2. The GRIN lenses 26 within the array are typically formed of cylinders of translucent material which function as lenses by virtue of variation in the refractive index of the material forming the lenses. Each of the lenses is formed by a cylinder of translucent material. In the example shown in FIG. 7 only one cylinder can be seen as the diagram is a longitudinal section through the PCB. One of the ends of the cylinder is cleaved at some predetermined angle (45° in this case) and metallised, thus creating a 45° mirror.

Light entering the lens from a corresponding one of the optical waveguides 8 in a radial direction is reflected through 90° and travels axially along the GRIN lens structure. Conversely, axial light travelling in the opposite direction will be reflected out of the GRIN lens if it encounters a 45° mirrored surface. Such an arrangement is particularly advantageous as the use of a GRIN lens in this way enables the natural divergence of commercially available diode laser beams (usually around 20°) to be negated, as the light travels between optical waveguides 8 and/or other photonic devices (not shown).

The casing 28 of the GRIN lens is also particularly advantageous. The casing enables several GRIN lenses to be packaged together in an array with precise known spacing between each individual lens. Thus, in combination with the alignment projection 12 used to locate the GRIN casing 28, the GRIN lenses are precisely located with respect to the optical waveguides 8. Of course, use of a casing 28 for the lens array is not essential, but represents a particularly preferred option.

Figure 8:
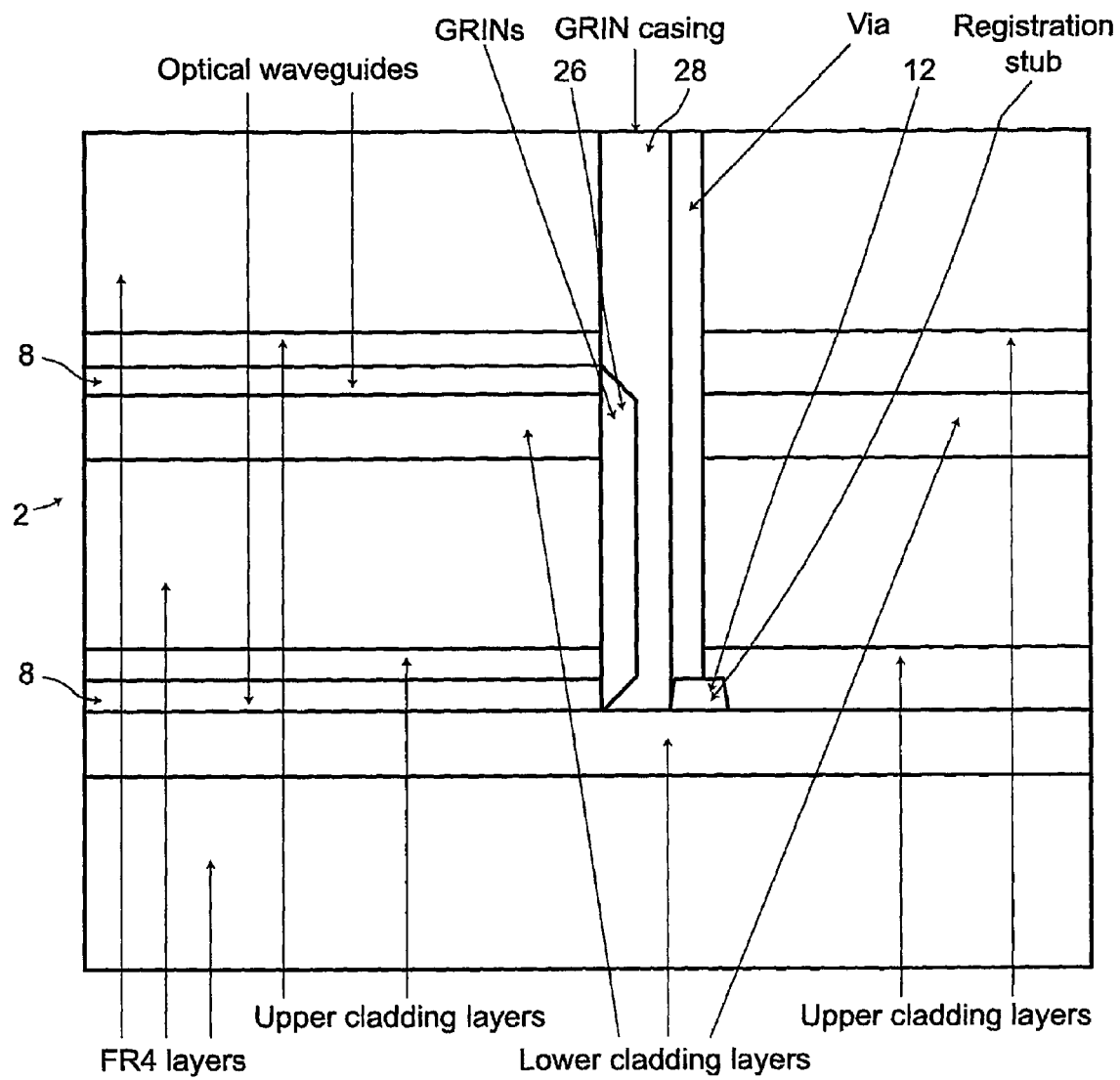
FIG. 8 shows a vertical section through an example of an optical PCB according to an embodiment of the present invention.

FIG. 8 shows a vertical section through an example of an optical PCB 2 according to a further embodiment of the present invention. In the example shown in FIG. 8, the optical PCB 2 is a multi-layer PCB having waveguides 8 formed in two or more layers. Light is routed from an optical waveguide in one of the layers to an optical waveguide 8 in another of the layers with the use of a GRIN lens 26 or another suitable form of lightguide. As described above with reference to FIGS. 6 and 7, alignment of the GRIN lens 28 with the interfaces of each of the optical waveguides in the different layers in the optical PCB 2 is ensured, by use of the alignment projection 12 and possibly also a specifically designed casing 28 for the GRIN lenses.

The arrangement of the optical PCB 2 in any of FIGS. 6 to 8 may be used to interface with any other desired optical component such as a vertical cavity surface emitting laser (VCSEL) or a photodiode array mounted on the upper surface of the support layer. This component (not shown) could also be precisely positioned using the alignment projection 12 formed on the optical PCB 2.

In embodiments, the invention provides a simple and robust method for manufacturing an optical PCB using lithographically etched features on a PCB core layer such as a polymer optical waveguide layer. By forming one or more optical alignment projections on the PCB, during the same step of forming one or more optical waveguides, very precise relative positioning between the alignment projections and the optical waveguides can be achieved. This therefore enables other optical components to be accurately aligned subsequently with respect to the optical waveguides. The method and apparatus described herein would be low-cost compared to conventional methods of achieving such a level of precision and repeatability. Indeed, the methods and apparatus described herein enable mass-production of optical PCBs requiring very high inter-component positional precision.

Figure 9:
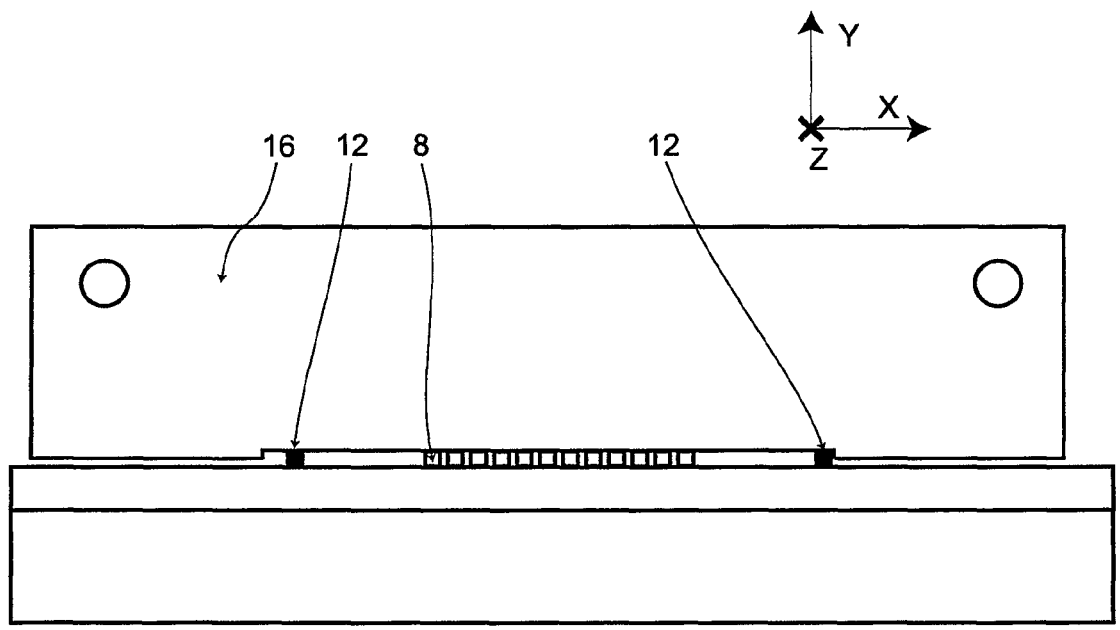
FIG. 9 shows a section through an example of an optical printed circuit board.

FIG. 9 shows an example of an optical printed circuit board having alignment feature 12 formed as described above at the same level as the optical waveguides 8. An MT mount 16 is provided arranged on top of the optical waveguides 8 and the alignment projections 12. Such an arrangement, in common with the arrangements of FIGS. 5A and 5B, allows for poor control of the lower cladding thickness without any significant adverse effect on the operation of the resulting device and so reduces the cost of enforcing tighter control during manufacture. The mount 16 rests on top of the waveguides and in this way Y alignment is achieved. In cases where the waveguides are formed of acrylate they are able to withstand pressure without affecting the optical properties thereof due to the tough nature of acrylate. Alignment in the X direction is achieved by the inner (or outer) surfaces of the feet of the mount 16 touching the alignment features 12 formed at the same time as the waveguides.

FIGS. 10 to 14 show examples of alignment features or projections 12 which are linear but are slanted or angled with respect to the longitudinal direction of the waveguides 8. The arrangement of the alignment features or projections 12 of each of FIGS. 10 to 14 enables self alignment of a mount 16 to the waveguides which maintains the X alignment irrespective of slight changes in fabrication tolerances which may cause over or under etching of the alignment features. Thus, alignment in the X and Y directions may be achieved to a very high tolerance. The alignment features or projections have longitudinal axes that are at an angle to the direction of the longitudinal axis of the waveguides. They may or may not be linear.

Figure 10:
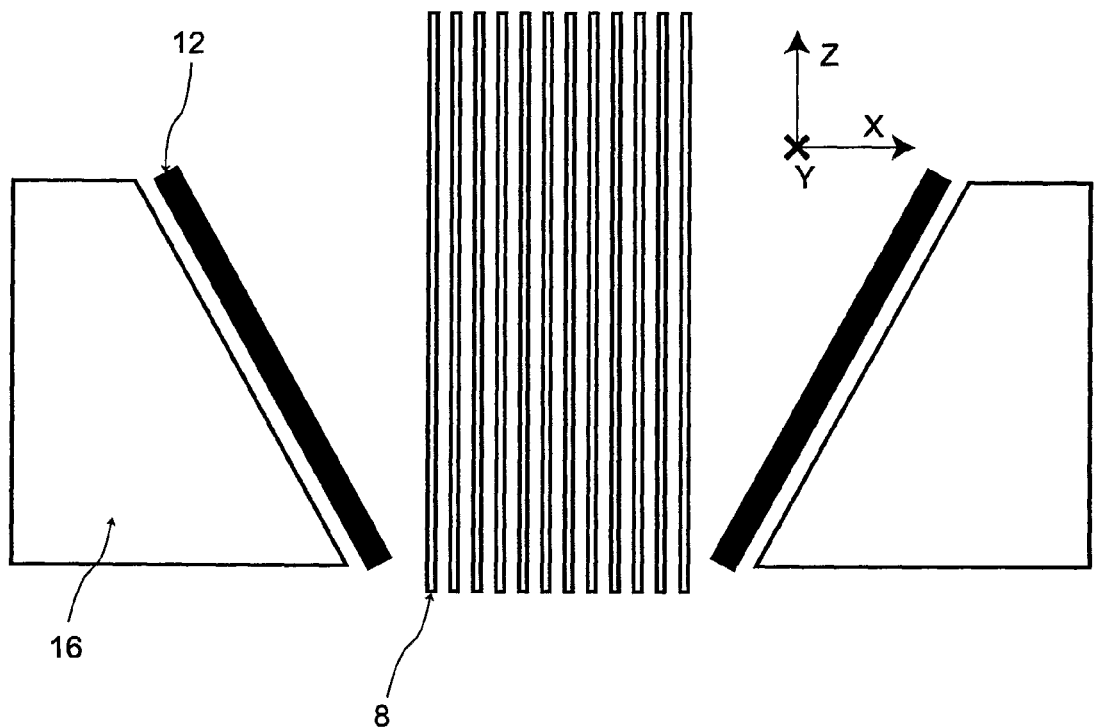
FIGS. 10 to 14 show examples of alignment features or projections.
Figure 11:
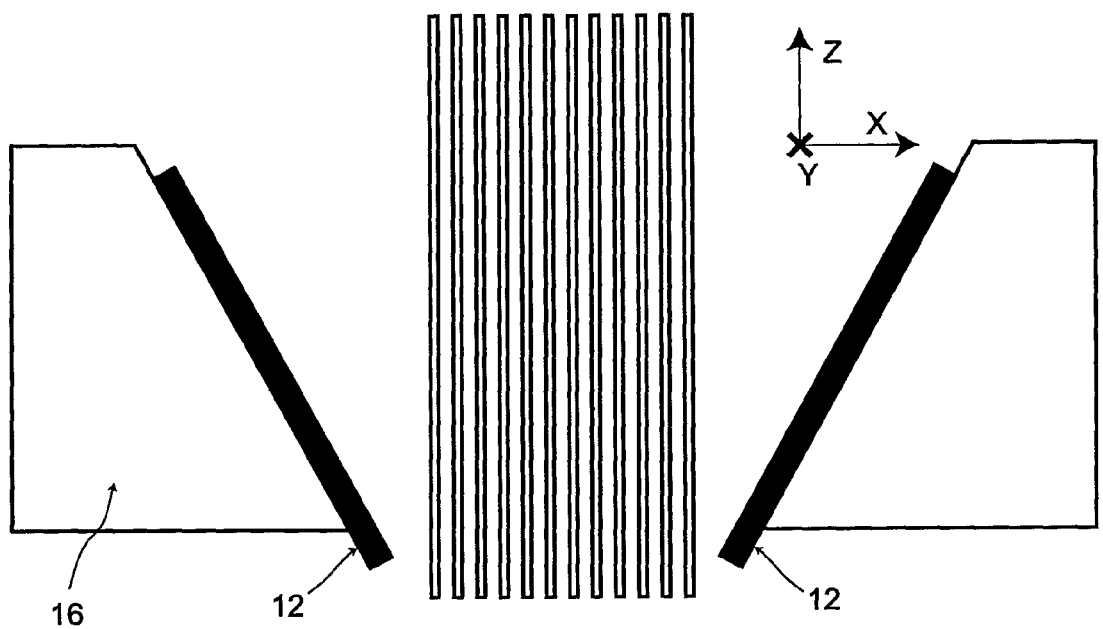

FIGS. 10 and 11 show an example of an optical printed circuit boards in which there has been no over- or under-etching. The thickness of the alignment projections 12 is as desired. In FIG. 10, the feet of the mount 16 are in an unengaged configuration with respect to the alignment projections 12. In FIG. 11, the mount 16 has been moved into a position such that the feet engage the alignment projections 12. As explained above, when in this configuration, the mount is able to receive a plug from another optical printed circuit board to enable optical communication between the other optical printed circuit board and the optical printed circuit board on which the mount is arranged.

Figure 12:
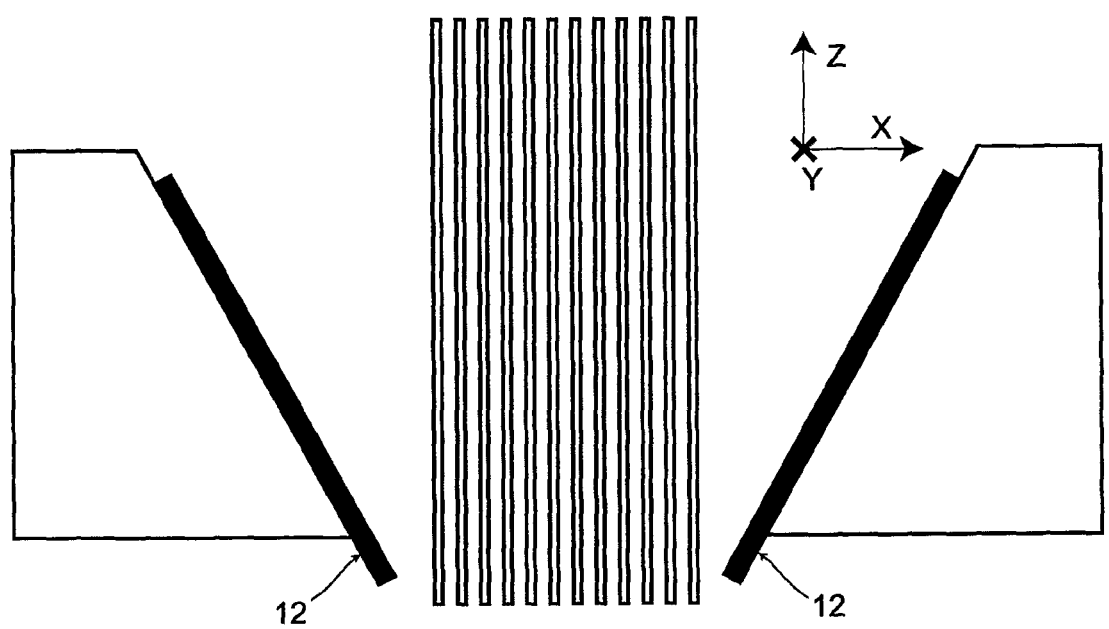
Figure 13:
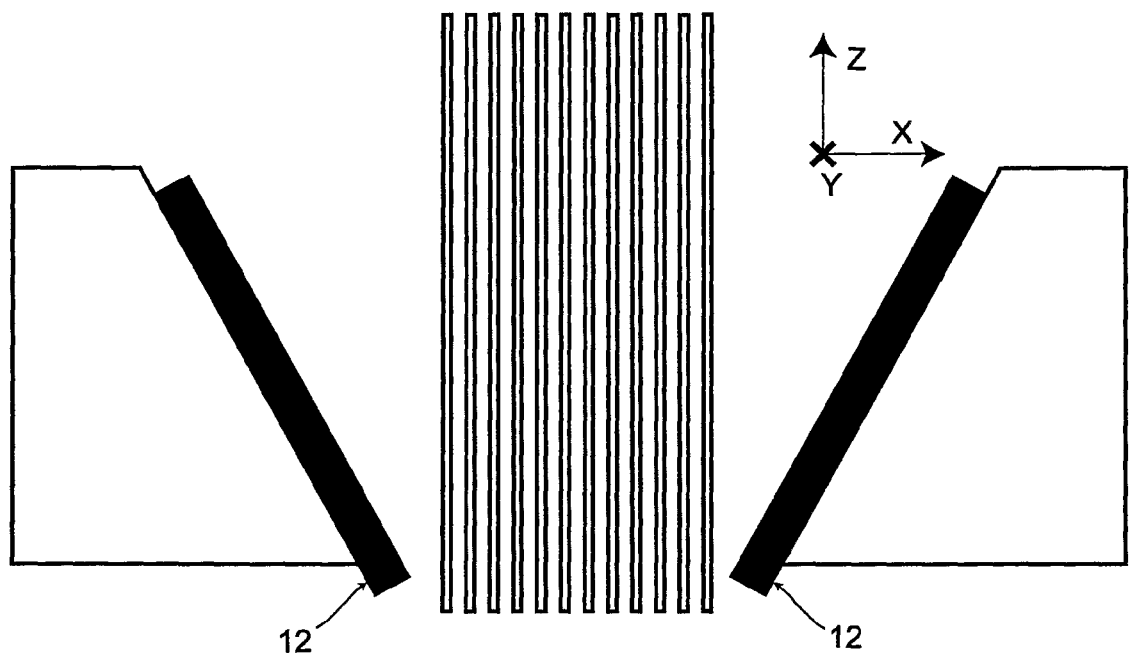
Figure 14:
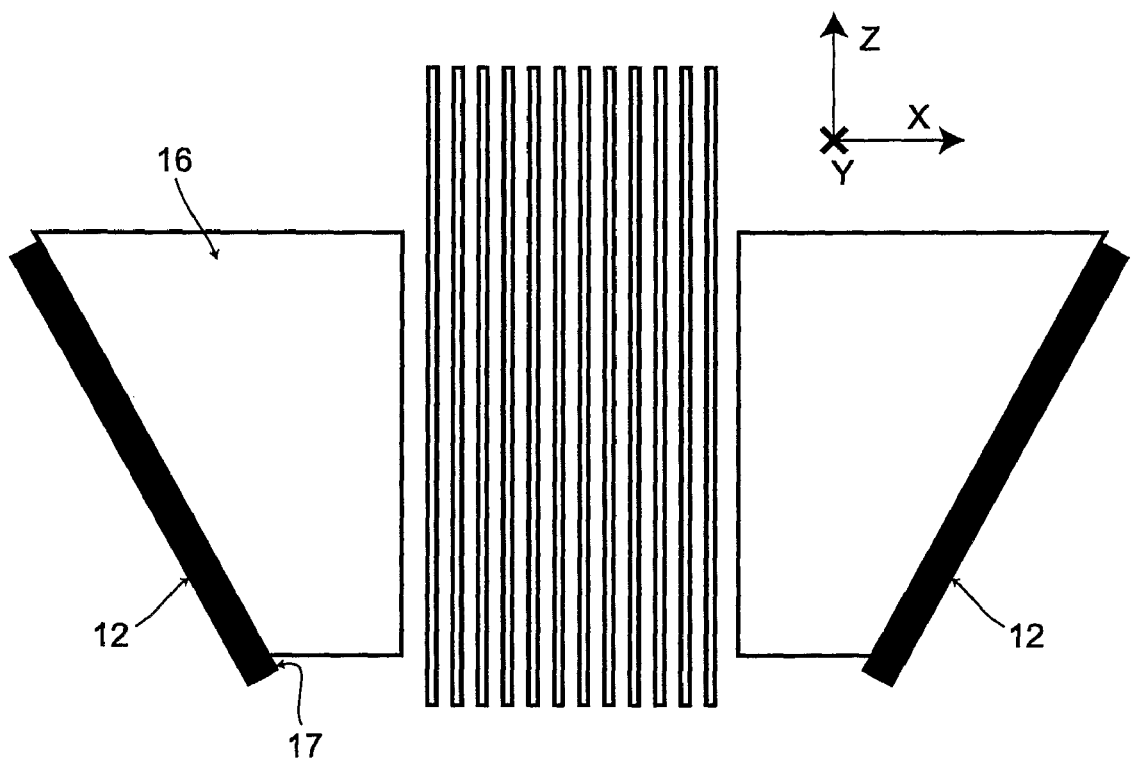

In FIGS. 12 and 13, an example is shown in which the alignment projections 12 have been over- and under-etched, respectively. Despite the over and under-etching, there is no misalignment in the X or Y directions. Although there is slight variation in the positioning along the Z axis, this alignment of a source in the Z direction is more tolerant and a much larger misalignment distance is possible before significant connection loss is experienced. Thus, due to the angled configuration of the alignment projections, the manufacturing method ensures that there is no significant variation in the quality of the optical printed circuit board even when manufacturing methods may cause variations in the thicknesses of the alignment features or projections. FIG. 14 shows an example like FIG. 10, except in the case of FIG. 14 the alignment features are referred to as exterior alignment features, in that the feet of the mount 16 are positioned for engagement with the internal side 17 of the alignment projections 12.

Figure 15:
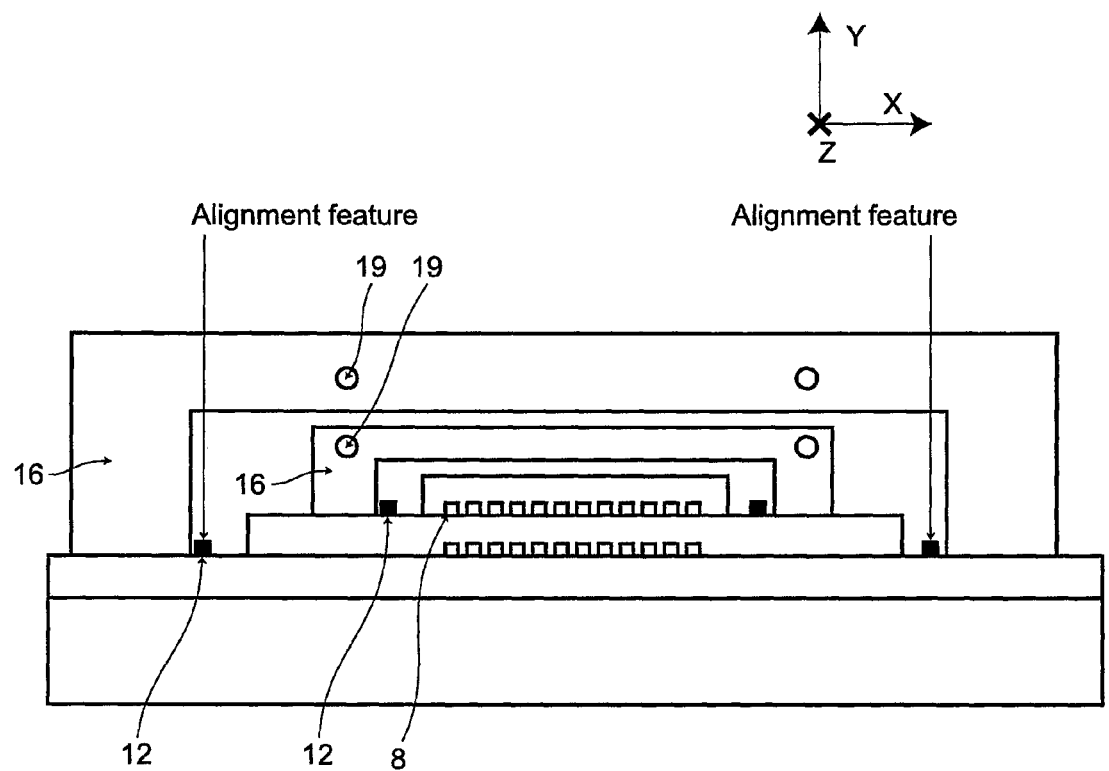
FIGS. 15 to 18 show examples of optical printed circuit boards or parts thereof.

FIG. 15 shows an example in which a nested arrangement of mounts 16 are provided on corresponding stepped layers of the optical printed circuit board. The layers of the optical printed circuit board are formed into stepped tiers. In the example shown in FIG. 15, openings are provided in each of the mounts 16 for receiving pins such as MT pins. The corresponding plug for engagement with the mounts 16 will preferably include nested plugs having pin sizes corresponding to the openings 19 provided in the corresponding mounts 16.

Each of the plugs in the nest is preferably capable of moving separately in the X and Y directions to allow for individual self-alignment for each layer. Typically, each plug in the nest of plugs would include a linear array of optical sources for engagement with corresponding ones of the waveguides 8. Alignment features 12 are provided on each of the lower cladding layers of the layers of the optical printed circuit board. The lower cladding layer of the uppermost layer of optical waveguides serves as the upper cladding layer of the lowermost layer of optical waveguides 8.

Figure 16:
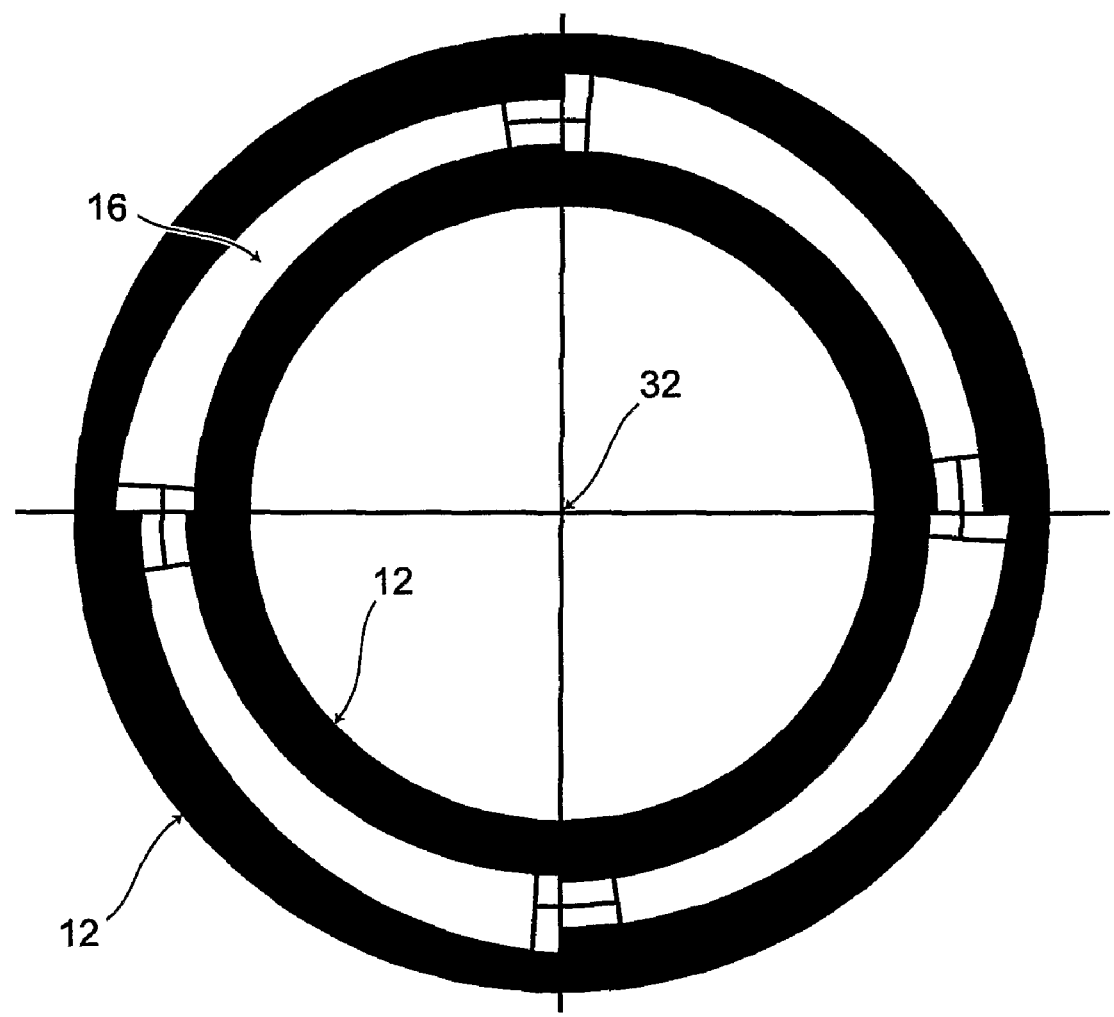
Figure 17:
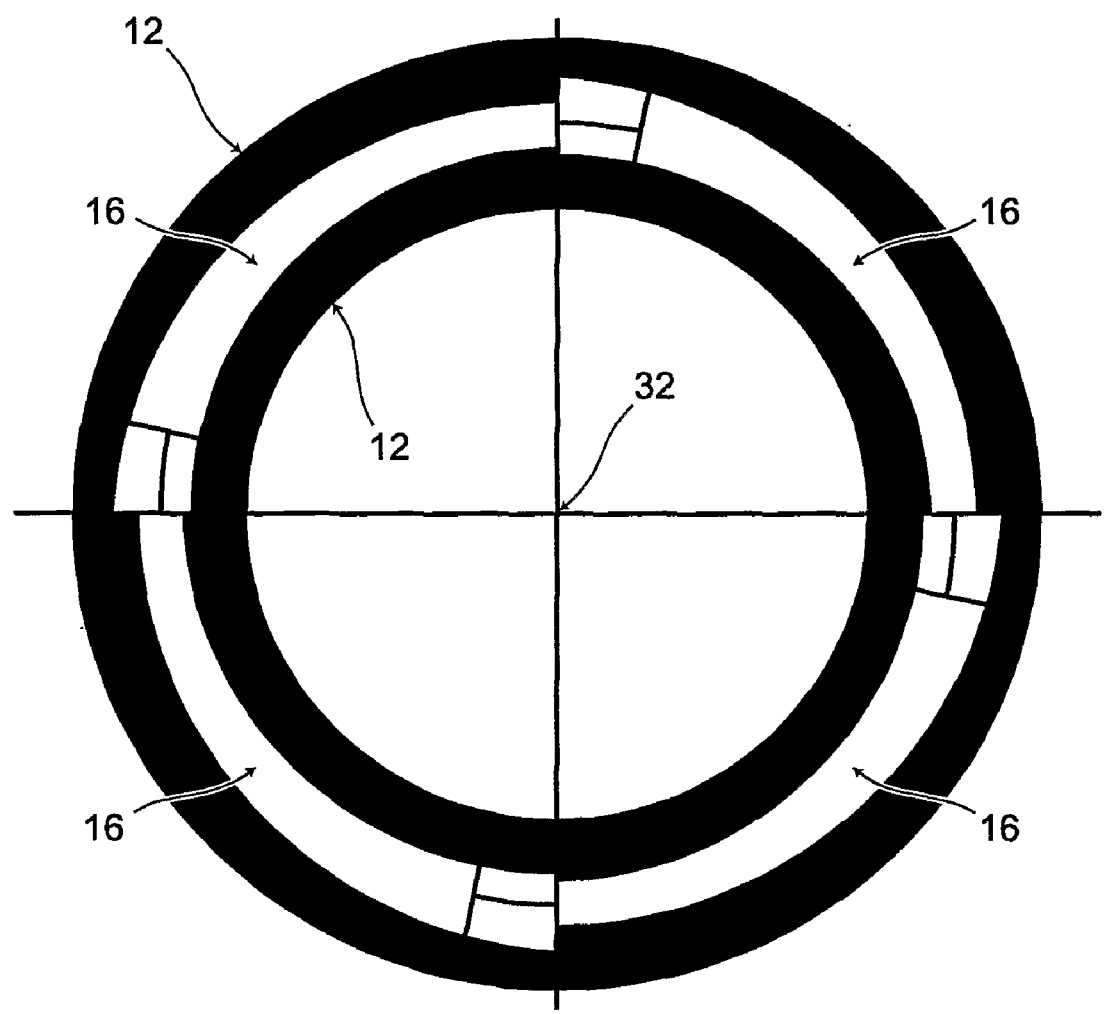

FIGS. 16 and 17 show a further example of a connector for use on an optical printed circuit board. The waveguides are not shown in FIGS. 16 and 17. The configuration of FIGS. 16 and 17 may be used to align a connector to a point on a flat area surface of a printed circuit board in the X and Z dimensions. The alignment features or projections 12 are bent around a circle to form a bent taper which is centred on a central alignment point 32. In the example shown, plural bent alignment features 12 are provided each covering an arc of 90° so as to provide a complete circle in combination. This is a preferred configuration.

Similarly, the foot of the mount 16 has the same bent taper but each taper has a slightly reduced length compared to that of the alignment features 12. Thus, the alignment features 12 form a slot into which the foot of the mount 16 may be inserted. When the mount 16 is rotated with its feet provided within the slots defined between the alignment features 12, at some relative position, the mount 16 will become locked with respect to the alignment projections 12.

If over-etching or under-etching occurs the mount 16 will rotate relative to the alignment features 12 to a greater or lesser extent. The degree of tapering may be set to determine the maximum additional rotation resulting from the over- or under-etching. FIG. 16 shows the arrangement of the mount 16 between the alignment features 12 but in an unlocked position. In FIG. 17, the mount 16 has been rotated clockwise with respect to the alignment features 12 so as to lock the mount 16 relative to the alignment features 12. As in the examples described above, upper cladding may be provided over a part of the alignment features 12. In the example of FIGS. 16 and 17, the upper cladding over the alignment features or projections is not however required.

Figure 18:
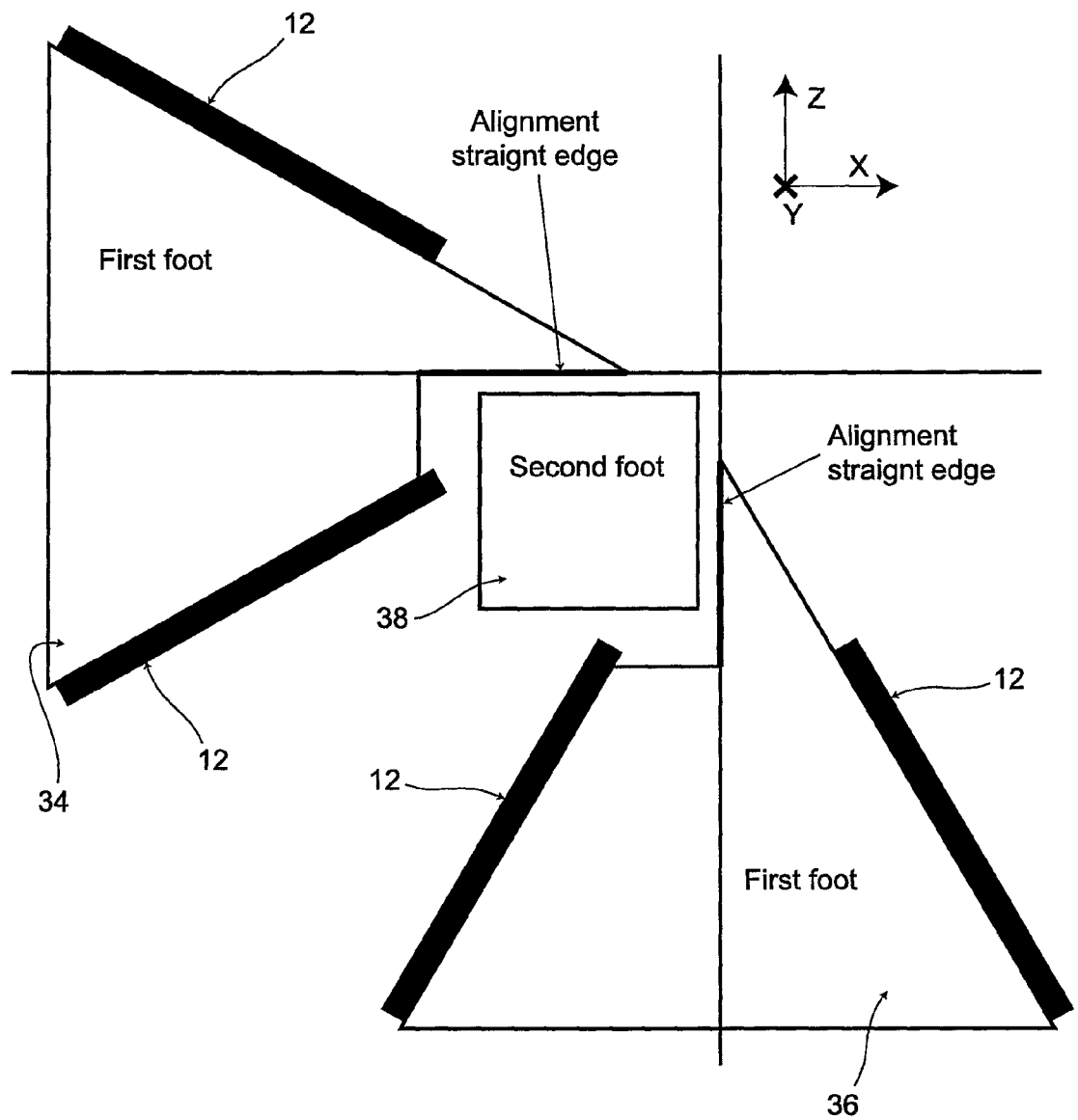

FIG. 18 shows an example of parts of an optical printed circuit board. Two pairs of alignment features or projections 12 are provided. A single pair of slanted linear edges or projections provides alignment in one dimension only. As explained above, where over-etching or under-etching occurs although the alignment in one direction will not be affected, alignment in the orthogonal dimension may be adversely affected. To overcome this problem, an arrangement such as that shown in FIG. 18 may be used, in which one pair of slanted linear alignment features or projections defines the X position of a line extending in the Z direction using an intermediate receptacle foot 34.

Another pair of slanted linear edge alignment projections or features defines the Z position of a line extending in the X direction using another intermediate receptacle foot 36. The respective pairs of the alignment features or projections may be over-etched or under-etched without affecting the position of the alignment straight edge of each one in the relevant direction. Thus, by the combination of both of the alignment straight edges or datum lines the positioning of the foot 38 of the mount may be accurately achieved.

Referring to FIG. 18, two datum lines in orthogonal directions define the precise positioning of a mount on an optical printed circuit board. In the example shown in FIG. 18, the foot 38 of the mount is shown before it has been positioned in its eventual location on the circuit board. When in position, the second foot 38 will abut the alignment straight edges of each of the components 34 and 36 as desired above. In the example of FIG. 18 the datum lines or alignment straight edges are orthogonal. In other examples the angle between the two straight edges need not be 90 degrees. It is merely necessary in this embodiment that the angle between the two alignment straight edges is the same as the angle between the two edges of the foot of the mount that is to be aligned.

Figure 19A:
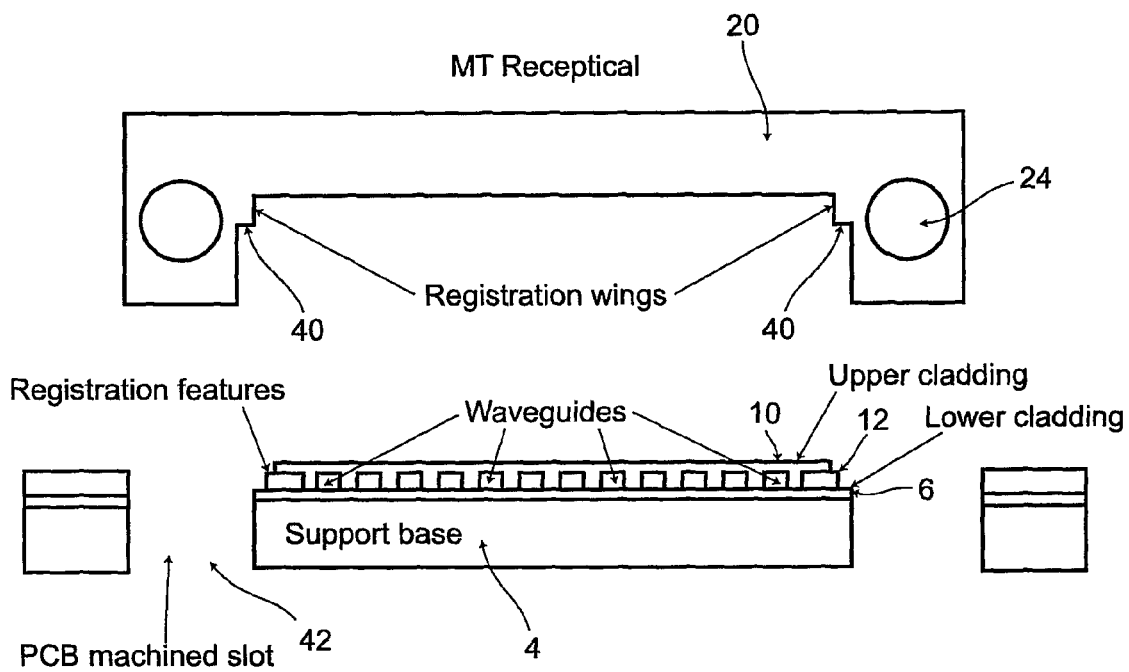
FIGS. 19A and 19B show an example of a section through an optical printed circuit board.
Figure 19B:
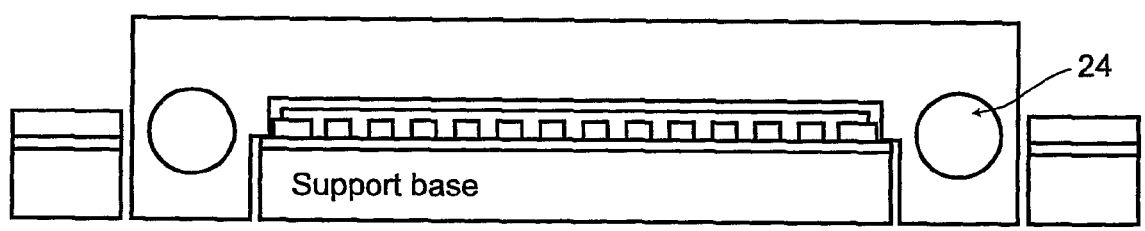

FIGS. 19A and 19B show a further example of an optical printed circuit board. In FIG. 19A, a mount such as an MT receptacle is provided for arrangement on an optical printed circuit board. The optical printed circuit board of FIG. 19B has a support layer 4 on which is formed a lower cladding layer 6. Plural waveguides 8 are formed on the lower cladding layer 6 and an upper cladding 10 is formed over the waveguides 8. Alignment features or projections 12 are formed and they are partially covered by an upper cladding 10. Preferably it is the same upper cladding as that used to cover the waveguides but this is not essential. A part of the alignment features or projections 12 is exposed which enables the mount 20 to be aligned thereto.

The mount 20 has registration wings 40 for engagement with the registration or alignment features or projections 12. Referring to FIG. 19B, the mount 20 is in position with the registration wings 40 engaged with the alignment features or projections 12. In the examples shown in FIGS. 19A and 19B, the openings 24 within the MT mount 20 are in line with the waveguides, meaning that they are at the same datum level as the waveguides. In the other examples described herein, the slots 24 within the MT mount are offset with respect to the level of the waveguides. This provides an advantage in that greater alignment accuracy can be achieved between an optical connector when plugged into the MT mount and the optical waveguides 8 since tilting effects are avoided.

The MT mount 20 has registration wings which make the critical alignment connection with the registration or alignment features or projections 12. Holes 42 are machined from the PCB support 4 to enable the feet of the mount 20 to pass through. The relative positioning of the openings 42 in the support 4 of the PCB do not need to be accurately positioned as the registration wings 40 of the mount 20 are the features that provide the alignment to the alignment features or projections 12.

Embodiments of the present invention have been described with particular reference to the examples illustrated. However, it will be appreciated that variations and modifications may be made to the examples described within the scope of the present invention.

The invention claimed is:

1. A method of manufacturing an optical printed circuit board, the method comprising:
   providing a support layer;
   on the support layer, forming one or more optical waveguides by providing an optical core layer comprising an optical core material and forming optical channels from the optical core layer;
   during said step of forming the optical waveguides, forming one or more alignment features or projections on the optical printed circuit board the alignment features or projections being formed from the optical core material and being configured to provide horizontal alignment with respect to the one or more waveguides; and
   providing a cladding layer to partially cover the alignment features or projections along their entire length such that part of the or each of the alignment features or projections is not covered by the cladding layer.

2. A method according to claim 1, comprising surrounding the optical channels with cladding thereby forming one or more optical waveguides.

3. A method according to claim 1, wherein the alignment projections are formed at the same level as the optical waveguides with respect to the support layer.

4. A method according to claim 1, wherein the optical waveguides and/or the optical projections are formed from the optical core layer using one or more of lithographic techniques, direct laser writing direct electron beam writing embossing, ink jet printing or micro jet printing.

5. A method according to claim 1, wherein the optical waveguides are formed on a lower cladding layer, the lower cladding layer being formed on a PCB support layer.

6. A method according to claim 5, wherein the step of forming the optical channels and the optical projections comprises
   forming an optical core layer;
   patterning the optical core layer to define regions where the waveguides and the alignment projections are to be formed, wherein the patterning of the waveguides and the alignment projections is performed using a common mask.

7. A method according to claim 6, in which the common mask includes an opening defining an optical alignment feature.

8. A method according to claim 7, comprising using a second mask to define the cladding layer to partially cover the alignment features or projections, wherein the second mask is optically aligned to the optical alignment feature formed using the common mask.

9. A method according to claim 1, comprising forming a via in the optical printed circuit board and locating one or more Graded Index lenses in the via to enable optical communication between one or more of the optical waveguides and the one or more Graded Index lenses, the or each of the Graded Index lenses including one or more angled deflection surfaces.

10. A method according to claim 1, in which the alignment features or projections are formed to have linear components at an angle to the direction of the longitudinal axis of the waveguides.

11. An optical printed circuit board, comprising:
    a support layer;
    one or more optical waveguides formed on the support layer the waveguides comprising a core formed of optical core material; and
    at least one alignment feature or projection formed on the support layer in a predetermined position with respect to the one or more optical waveguides the alignment feature or projection being formed from optical core material, thereby enabling horizontal alignment of other components with the optical waveguides by reference to the at least one alignment feature or projection, wherein an upper cladding is provided to partially cover the or each of the alignment features or projections along their entire length.

12. An optical printed circuit board according to claim 11, wherein the at least one alignment projection is formed at the same level with respect to the support layer as the one or more optical waveguides.

13. An optical printed circuit board according to claim 11, wherein the at least one alignment projection including an L-shape, at least one of the parts of the L-shape alignment projection being substantially parallel or perpendicular to at least one of the optical waveguides.

14. An optical printed circuit board according to claim 13, wherein one part of the L-shape alignment projection is perpendicular to the one or more optical waveguides and the other part of the alignment projection slopes either towards or away from the optical waveguides.

15. An optical printed circuit board according to claim 11, comprising a lower cladding layer on which the one or more optical waveguides are formed.

16. An optical printed circuit board according to claim 15, comprising an upper cladding layer formed on top of the one or more optical waveguides and the lower cladding layer, such that, in section, the one or more optical waveguides are entirely surrounded by the combination of the upper and lower cladding layers.

17. An optical printed circuit board according to claim 16, comprising a via that extends from the support layer through the cladding layer and provides access to an input interface of one or more of the optical waveguides.

18. An optical printed circuit board according to claim 17, comprising one or more graded index lenses or graded index waveguides or fibres provided in the via for communicating light signals to and from the one or more optical waveguides, the or each of the Graded Index lenses including one or more angled deflection surfaces.

19. An optical printed circuit board according to claim 18, comprising at least two layers of optical waveguides, communication between waveguides in the at least two layers being enabled via the graded index lenses.

20. An optical printed circuit board according to claim 11, in which the or each of the alignment features or projections has a longitudinal axis at an angle to the direction of the longitudinal axis of the or each of the waveguides.

21. An optical printed circuit board according to claim 11, comprising a mount arranged on the circuit board in alignment with the or each of the alignment features or projections.

22. An optical printed circuit board according to claim 21 wherein the mount is configured for receiving a connector from a second optical printed circuit board.

23. An optical printed circuit board according to claim 21, in which the mount has at least one socket or opening to enable engagement with a connector from a second optical printed circuit board or other optical component.

24. An optical printed circuit board according to claim 23, in which the at least one socket or opening is at the same level as the or each waveguide.

25. A method of manufacturing an optical printed circuit board, the method comprising:
providing a support layer;
on the support layer, forming one or more optical waveguides including optical core material;
during said step of forming the optical waveguides, forming one or more alignment projections on the optical printed circuit board the alignment projections being formed from optical core material and being arranged so as to enable horizontal alignment with respect to the one or more optical waveguides, the alignment projections being only partially covered by an upper cladding, the partial covering extending along their entire length; and,
arranging a socket in alignment with the one or more alignment projections for receiving a plug for connection to an optical backplane or other optical component.

* * * * *